Sept. 22, 1936. E. W. KELLOGG Re. 20,114

ELECTRICAL SYSTEM

Original Filed March 25, 1927

Inventor:
Edward W. Kellogg,
by Alexander S. Lowe
His Attorney.

Reissued Sept. 22, 1936 Re. 20,114

UNITED STATES PATENT OFFICE 20,114

ELECTRICAL SYSTEM

Edward W. Kellogg, Moorestown, N. J., assignor to General Electric Company, a corporation of New York Original No. 1,820,809, dated August 25, 1931, Serial No. 178,476, March 25, 1927. Application for reissue August 9, 1933. Serial No. 684,441

18 Claims. (Cl. 250—20)

Figure 1:
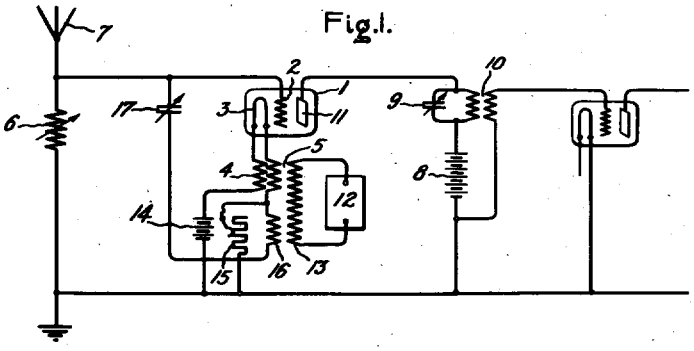

My invention relates to electrical systems comprising a space discharge device having its input circuit connected to an antenna through a local high frequency source, and has for its principal object the provision of an improved arrangement whereby the feeding of energy from the input circuit into the antenna may be prevented.

In heterodyne systems comprising an antenna and a local source or oscillator operated at a frequency slightly different from that of the antenna for producing a low frequency beat voltage, it is customary to connect the oscillator, or a coil inductively coupled thereto, in series with the antenna tuning coil, between the cathode and the grid of the space discharge device so that the oscillator voltage plus the antenna voltage is applied between the grid and cathode of the device. In producing a voltage between grid and cathode of the space discharge device, the local source or oscillator incidentally impresses a voltage across the antenna tuning. The oscillator voltage is in fact divided between the two circuit elements, antenna tuning and grid to cathode capacity, and the fraction of the oscillator voltage which is impressed across the antenna tuning depends on the impedance drops through two different parts of the circuit. The grid to cathode capacity reactance is of the order of 10,000 ohms at broadcasting wave lengths. The impedance of the tuned antenna circuit varies from a few hundred ohms when the oscillator is operated at a frequency substantially different from that for which the antenna is tuned to from 10,000 to 40,000 ohms when the oscillator frequency is substantially the same as that for which the antenna is tuned.

As long as the frequency of the oscillator is substantially different from that for which the antenna is tuned, there is little variation in the antenna voltage produced by adjustment in the frequency of the oscillator. In the operation of tuning in stations, however, the frequency of the oscillator frequently crosses that for which the antenna is tuned and the antenna voltage is varied in a manner to interfere with other receiving sets.

In accordance with my invention, this difficulty is avoided by connecting the oscillator to the input circuit in such a way that the potential of the grid with respect to ground (assuming one end of the antenna tuning coil to be grounded) is substantially unaffected by the oscillator voltage, while the necessary cathode to grid voltage is obtained by causing the cathode to vary in potential with respect to ground, at oscillator frequency.

It will be understood that while my invention is described herein as embodied in a heterodyne system, the invention is not to be held limited to use in such system. My invention considered in its broadest aspect is directed to a radio system or the like comprising a space discharge device having at least two electrodes, and having two input circuits for the device, the two input circuits being operatively associated respectively with one and the other of the two electrodes, whereby a varying voltage is impressed on one electrode of the space discharge device, for example between the grid and ground or a point of reference potential, and a second varying voltage is impressed on another electrode of the space discharge device, for example between the cathode and ground or point of reference potential, means being preferably provided to prevent reaction between the two input circuits.

My invention will be better understood from the following description when considered in connection with the accompanying drawing and its scope will be pointed out in the appended claims.

Figure 2:
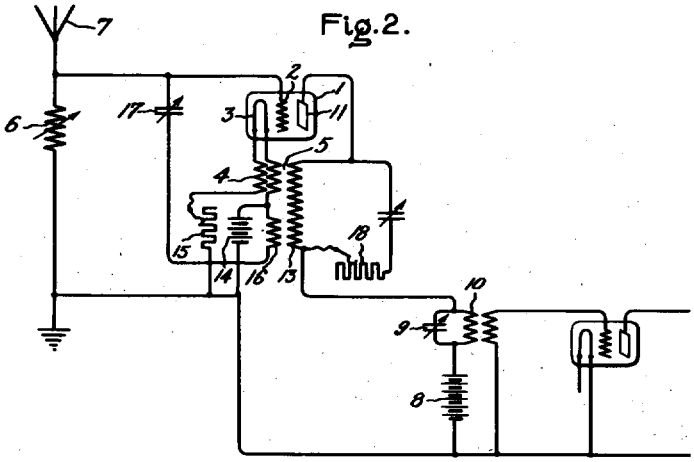
Figure 3:
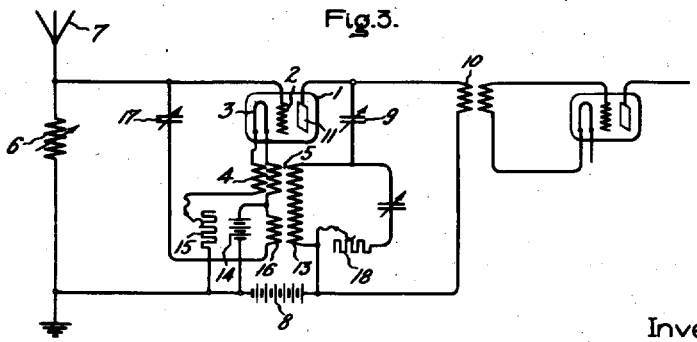

Referring to the drawing, Fig. 1 diagrammatically illustrates a heterodyne system wherein my invention has been embodied; and Figs. 2 and 3 illustrate its application to slightly different autodyne systems.

Fig. 1 shows a detector device 1 which is provided with an input circuit comprising a grid 2, a cathode 3, a double-wire secondary winding 4 of a transformer 5, and a tuning element 6 connected between an antenna 7 and the ground which may be considered to be the low potential end of the input circuit. The device 1 is also provided with an output circuit comprising the cathode 3, the secondary circuit 4, a source 8, an intermediate frequency tuning element comprising a condenser 9 and a transformer winding 10, and an anode 11. A local source of oscillations or oscillator 12 is connected to the input circuit of the device 1 through a primary winding 13 and the secondary winding 4 each turn of which is made of double wire in order to permit the transmission of heating current to the cathode 3 from a source 14 through a control resistor 15. A winding 16, inductively related to the winding 13, is connected to the grid 2 or high potential end of the input circuit through a condenser 17 for the purpose of neutralizing the effect of the capacity coupling between the grid 2 and the cathode 3.

With these connections, the oscillator 12 causes the potential of the cathode 3 to change with respect to ground or low potential end of the input circuit but produces little, if any, effect on the potential of the grid 2. Since the anode 11 is virtually grounded through the intermediate frequency tuning condenser 9, there is no tendency for currents of oscillator frequency to get into the antenna circuit by way of the grid to anode capacity. The potential of the antenna 7 with respect to ground is thus substantially unaffected by the oscillator and interference with other receivers is avoided.

Fig. 2 illustrates an autodyne system wherein a resistor 18 is connected in the oscillator circuit to permit adjustment in intensity of the oscillations. In the case of the autodyne circuit, an appreciable impedance at oscillator frequency is introduced by the feed back coil in the anode circuit, and therefore the anode is no longer maintained at practically stationary potential as in the previous case. Under these conditions the balancing condenser 17 would need to be readjusted in order that it might balance out the electrostatic effect on the grid, of both cathode and anode capacities. If the coupling between coil 5 and coils 4 and 16 can be maintained constant, the ratio between cathode and anode voltages at oscillation frequency will remain substantially constant, and a single setting of condenser 17 will suffice for balancing out the electrostatic effects of both anode and cathode on the grid potential. The rheostat 18 provides means whereby the amount of feed back can be controlled without changing the coupling between coil 13 and coils 4 and 16. It should be borne in mind in following this discussion that the output circuit 9, 10, is tuned for a frequency which differs widely from the oscillation frequency and has negligible impedance for the oscillation currents.

If it is desired to maintain the rheostat 18 at constant potential, the oscillator tuned circuit may be connected in series with the intermediate tuning condenser 9 as shown in Fig. 3.

The embodiments of the invention illustrated and described herein have been selected for the purpose of clearly setting forth the principles involved. It will be apparent, however, that the invention is susceptible of being modified to meet the different conditions encountered in its use. For example the circuit 6—7 which is represented as an antenna, might instead, be a receiving loop, and it is not necessary to have any part of the circuit actually grounded, the ground indicated in the drawing being primarily a reference potential. It is also apparent that where the cathode is of the radiation heated type rather than the hot filament type, the coil would not have to be of double wire. I therefore aim to cover by the appended claims all modifications within the true spirit and scope of my invention.

What I claim as new and desire to secure by Letters Patent of the United States, is:—

1. A radio apparatus of the heterodyne type including a detector tube, an input circuit for said tube having a low potential end connected with the cathode of the tube for impressing a signal voltage upon said tube, an output circuit for said tube, means providing a common grounded connection between said output circuit and said low potential end of said input circuit, a source of oscillations, and means coupled with said source and interposed in circuit between the low potential end of the input circuit and said cathode for causing the cathode potential to vary with respect to the low potential end of said input circuit.

2. A radio apparatus of the heterodyne type including a detector tube, an input circuit for said tube having a low potential end connected with the cathode of the tube for impressing a signal voltage upon said tube, an output circuit for said tube, means providing a common grounded connection between said output circuit and said low potential end of said input circuit, a source of oscillations, means coupled with said source and interposed in circuit between the low potential end of the input circuit and said cathode for causing the cathode potential to vary with respect to the low potential end of said input circuit, and means providing a coupling between said source and the high potential end of the input circuit for neutralizing the inter-electrode capacity of the tube.

3. In a radio apparatus of the heterodyne type, the combination with a source of oscillations and an electric discharge device having a grid, a cathode and an anode, and a tuned input circuit connected between said grid and cathode, of means for impressing the oscillations of said source upon said device without radiating the same from said tuned circuit, including a ground connection for said input circuit, a transformer having a primary winding connected with said source and a secondary winding interposed in circuit between the cathode and the ground connection.

4. In an electrical apparatus of the high frequency heterodyne type, the combination with an electric discharge device having a grid, an anode and a cathode, of a ground connection, an input signal voltage circuit for said device connected between the ground connection and the grid of said device, an output circuit connected between the ground connection and the anode, and means for applying an oscillation voltage at a different frequency from the signal voltage interposed between the ground connection and the cathode.

5. In an electrical apparatus of the high frequency, heterodyne type, the combination with an electric discharge device having a grid, an anode and a cathode, of a ground connection, an input signal voltage circuit for said device connected between the ground connection and the grid of said device, an output circuit connected between the ground connection and the anode, means for applying an oscillation voltage between the ground connection and the cathode, and means connected between the ground connection and the grid of said device for neutralizing the inter-electrode capacity of said device.

6. In a radio receiving apparatus of the heterodyne type, the combination with an electric discharge device having a grid, an anode and a cathode, of a ground connection, an input signal voltage circuit for said device connected between the ground connection and the grid of said device, an output circuit connected between the ground connection and the anode, means for applying an oscillation voltage at a different frequency from the signal voltage between the ground connection and the cathode, and means for tuning said input and output circuits.

7. In an electrical apparatus of the high frequency, heterodyne type, the combination with an electric discharge device having a grid, an anode and a cathode, of a ground connection, an input signal voltage circuit for said device connected between the ground connection and the grid of said device, an output circuit connected between the ground connection and the anode, and means for applying an oscillation voltage between the ground connection and the cathode, and means for adjusting the intensity of the oscillation voltage applied from said source.

8. The combination with an electric discharge device of the self-heterodyne type having a grid, an anode, a cathode, an input circuit connected with the grid and an output anode circuit, of means for applying self-heterodyne oscillations to said device, said means including a transformer having a primary connected in said output circuit, means connected in circuit with the primary for varying the frequency of the self-heterodyne oscillations, means in circuit with the primary for varying the strength of said oscillations, a secondary for said transformer, said secondary providing a common connection between said input and output circuits and the cathode of said device, and a neutralizing means including a winding inductively coupled with said primary connected in parallel with the input circuit.

9. The method of heterodyning a radio signal which comprises applying a signal voltage at a certain frequency between the grid of an electric discharge device and ground, and simultaneously applying an oscillation voltage at a different frequency between ground and the cathode of said device.

10. The method of heterodyning a radio signal which comprises applying a signal voltage at a certain frequency between the grid of an electric discharge device and ground, neutralizing the inter-electrode capacity of the device, and simultaneously applying an oscillation voltage at a different frequency between ground and the cathode of said device.

11. An electrical apparatus including an electric discharge device having at least two electrodes, two input circuits for said device, a ground point for said circuits, means to cause voltage variations in one of said input circuits and to vary the potential of one only of said two electrodes with respect to said ground point at a given frequency in accordance with said voltage variations in said one of the input circuits, means operating independently of said one of said input circuits to cause voltage variations in the other of said input circuits and to vary the potential of the other only of said two electrodes with respect to said ground point at another frequency in accordance with said voltage variations in said other of the input circuits, and means to prevent reaction between the two input circuits.

12. In an apparatus of the class described, an electron tube comprising a cathode, an anode and a grid, a relatively high frequency input circuit connected to said grid and said cathode and having a point of low potential for said high frequency, a relatively low frequency output circuit connected between said plate and said cathode, means for translating high frequency input in said input circuit into low frequency output in said output circuit, and means including an input source having a frequency different from that of said input circuit in series with the input circuit between the cathode and said point of low potential of said high frequency input circuit.

13. In an apparatus of the class described, an electron tube comprising a cathode, an anode and a grid, a relatively high frequency input circuit connected to said grid and said cathode, a relatively low frequency output circuit connected between said plate and said cathode, means for translating high frequency input in said input circuit into low frequency output in said output circuit, and means including a source of input energy having a frequency different from that of said input circuit in series relationship to the input circuits and output circuits connected to said cathode.

14. In an electron tube amplifying system, an electron tube comprising a cathode, an anode and a grid, a cathode terminal, a connection between said cathode and said cathode terminal, a relatively high frequency input circuit connected between said cathode terminal and said grid, a relatively low frequency output circuit connected between said cathode terminal and said anode, means for translating high frequency current in said input circuit into low frequency current in said output circuit, and means including an independent source of input energy in series with the circuit connection between said cathode and said cathode terminal.

15. In a radio receiving apparatus, an output amplifier including an electron tube having a cathode, an anode and a grid electrode, a detector tube having a cathode, an anode and a grid electrode, a high frequency input circuit for said detector tube connected between the grid and the cathode thereof and having a point of low potential for said high frequency, an input element connected in said input circuit to impress said high frequency energy upon said detector tube, means associated with said detector tube for translating high frequency impulses in the input circuit thereof into low frequency impulses in the output thereof, means impressing the output of said detector tube on said output amplifier, and an independent input source having a frequency different from that of said input circuit connected in series with the input circuit of said detector tube between the cathode thereof and said point of low potential of said high frequency input circuit.

16. In a radio receiving apparatus, an output amplifier including an electron tube having a cathode, an anode and a grid electrode, a detector tube having a cathode, an anode and a grid electrode, an input circuit for said detector tube connected between the grid and the cathode thereof, a high frequency input element connected in said input circuit to impress high frequency upon said detector tube, means associated with said detector tube for translating high frequency impulses in the input circuit thereof into low frequency impulses in the output thereof, means impressing the output of said detector tube on said output amplifier, and an independent source of input energy having a frequency different from that of said input circuit connected in series with the input circuit of said detector tube between the cathode thereof and the low potential point of said input circuit.

17. In an electron tube amplifying system, an electron tube comprising a cathode, an anode and a grid, an input circuit including a relatively high frequency input source connected between said grid and said cathode, a relatively low frequency output circuit connected between said anode and said cathode, means for translating high frequency current in said input circuit into low frequency current in said output circuit, an additional source of input energy having a frequency different from that of said input circuit connected in said input circuit in series relationship between said high frequency input source and said cathode, and a ground connection to a point of said input circuit between said high frequency input source and said additional source of input energy.

18. An oscillator-modulator circuit including a tube having input electrodes including a common electrode, and output electrodes including said common electrode, a tunable circuit connected between an input electrode and said common electrode and adapted to respond to currents which it is desired to modulate, an oscillation circuit coupled to an output electrode and said common electrode and including an inductance, and an inductive coupling between said inductance and said common electrode, whereby there are impressed on said last-mentioned electrode currents of the frequency by which it is desired to modulate the incoming signal currents.

EDWARD W. KELLOGG.